(12) United States Patent
Bertram

(10) Patent No.: US 7,193,445 B2
(45) Date of Patent: Mar. 20, 2007

(54) NON-INVERTING DOMINO REGISTER

(75) Inventor: Raymond A. Bertram, Austin, TX (US)

(73) Assignee: IP-First, LLC, Fremont, CA (US)

(*) Notice: Subject to any disclaimer, the term of this patent is extended or adjusted under 35 U.S.C. 154(b) by 233 days.

(21) Appl. No.: 10/640,369

(22) Filed: Aug. 13, 2003

(65) Prior Publication Data
US 2004/0034681 A1 Feb. 19, 2004

Related U.S. Application Data

(60) Provisional application No. 60/402,962, filed on Aug. 14, 2002.

(51) Int. Cl.
*H03K 19/096* (2006.01)
*H03K 19/20* (2006.01)

(52) U.S. Cl. ...................... 326/95; 326/121

(58) Field of Classification Search .............. 326/93, 326/95, 98, 121, 83
See application file for complete search history.

(56) References Cited

U.S. PATENT DOCUMENTS

| | | | |
|---|---|---|---|
| 5,075,386 A | 12/1991 | Vanderbilt | |
| 5,889,979 A | 3/1999 | Miller, Jr. et al. | |
| 5,926,038 A | 7/1999 | Fouts et al. | |
| 6,191,618 B1* | 2/2001 | Gayles et al. | 326/95 |
| 6,265,899 B1 | 7/2001 | Abdel-Hafeez et al. | |
| 6,496,038 B1* | 12/2002 | Sprague et al. | 326/95 |
| 6,560,737 B1 | 5/2003 | Colon-Bonet et al. | |
| 6,628,143 B2 | 9/2003 | Hsu et al. | |
| 6,650,145 B2* | 11/2003 | Ngo et al. | 326/98 |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |
| 2004/0257115 A1 | 12/2004 | Bertram et al. | |
| 2005/0046446 A1 | 3/2005 | Qureshi et al. | |
| 2005/0110522 A1 | 5/2005 | Hoekstra | |

* cited by examiner

*Primary Examiner*—Daniel Chang
(74) *Attorney, Agent, or Firm*—Gary R. Stanford; Richard K. Huffman; James W. Huffman (57) ABSTRACT

A non-inverting domino register including a domino stage, a storage stage, a keeper circuit and an output stage. The domino stage includes evaluation logic, coupled between evaluation devices at a pre-charged node, which evaluates a logic function. The storage stage drives a first preliminary output node and includes a pull-up device and a pull-down device both responsive to the pre-charged node, and a second pull-down device responsive to the clock signal. The keeper circuit is a cross-coupled pair of inverters coupled between the first preliminary output node and a second preliminary output node. The output stage includes a pair of pull-up and pull-down devices for driving an output node. The first pull-up device and the first pull-down device are both responsive to the pre-charged node, and the second pull-up device and the second pull-down device are both responsive to the second preliminary output node.

17 Claims, 5 Drawing Sheets

NON-INVERTING DOMINO REGISTER

CROSS-REFERENCE TO RELATED APPLICATIONS

This application claims the benefit of U.S. Provisional Application No. 60/402962, filed on Aug. 14, 2002, which is herein incorporated by reference for all intents and purposes.

BACKGROUND OF THE INVENTION

1. Field of the Invention

The present invention relates to dynamic logic and register functions, and more particularly to a non-inverting domino register that addresses the problem of registering the outputs of complex logic circuits where speed and size are important factors.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding data-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the data-to-output time requirements that must be satisfied by logical evaluation circuits in order to ensure stable registered outputs. It is desired to reduce these delays to provide additional time in each stage and to thereby increase overall speed of the pipeline system.

Figure 1A:
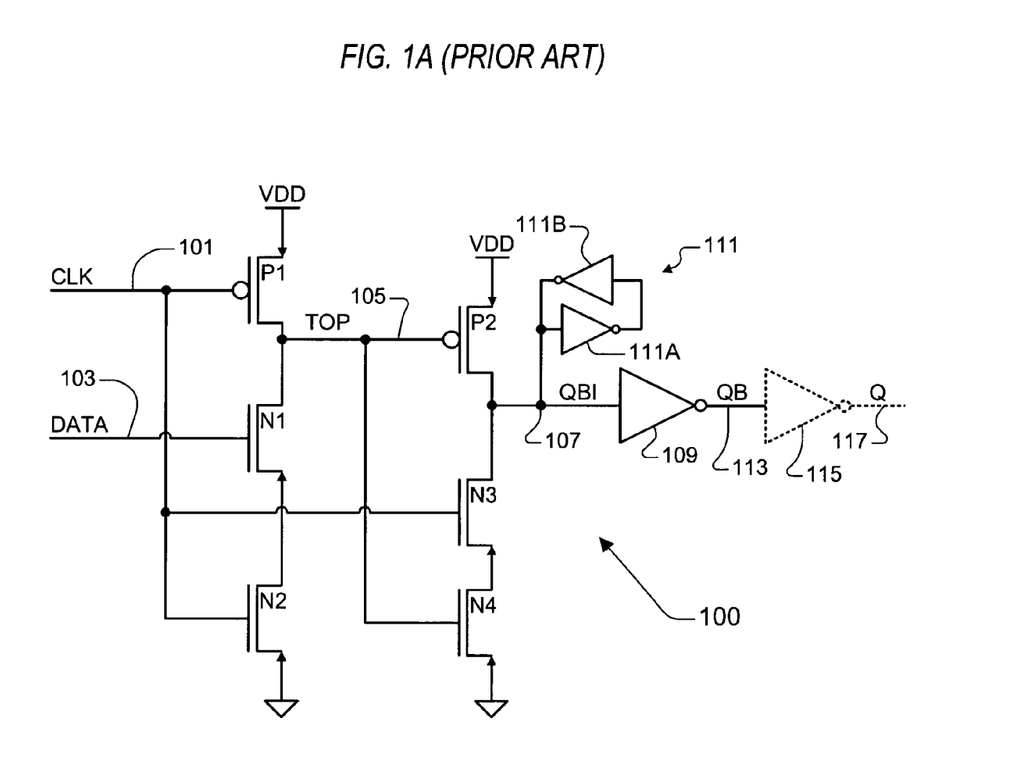
FIG. 1A is a schematic diagram of a traditional inverting domino register.

FIG. 1A is a schematic diagram of a traditional inverting domino register 100. The inverting domino register 100 attempts to address one aspect of the above-described problems, which enables logic designers combine logic evaluation functions with their corresponding registers. The inverting domino register 100 includes a logic evaluation input stage, or domino stage, which consists of stacked P-channel and N-channel devices P1, N1 and N2. P1 and N2 are a complementary pair of evaluation devices and N1 represents evaluation logic. The source of P1 is coupled to a voltage source VDD and its drain is coupled to node 105 providing a signal TOP. The drain of N1 is coupled to node 105 and its source is coupled to the drain of N2. The source of N2 is coupled to ground. An input clock signal CLK is provided via node 101 to the gates of P1 and N2. An input data signal DATA is provided via node 103 to the gate of N1.

The domino stage is followed by a storage stage, a weak keeper circuit 111, and, for noise reduction, at least one inverter/buffer 109. The storage stage includes devices P2, N3 and N4. Node 101 is coupled to the gate of N3 and node 105 is coupled to the gates of P2 and N4. The source of P2 is coupled VDD and its drain is coupled to node 107 providing an intermediate output signal QBI. Node 107 is coupled to the input of the inverter 109, to the drain of N3 and to the weak keeper circuit 111. The source of N3 is coupled to the drain of N4, which has its source coupled to ground. The keeper circuit 111 includes a first inverter 111A having its input coupled to node 107 for receiving the QBI signal and its output coupled to the input of a second inverter 111B, which has its output coupled to node 107. The inverter 109 has an output coupled to node 113 providing an inverting output signal QB. As described further below, an additional inverter/buffer 115, shown using phantom lines, may be added having its input coupled to node 113 and its output coupled to node 117 providing a non-inverted output signal Q.

Figure 1B:
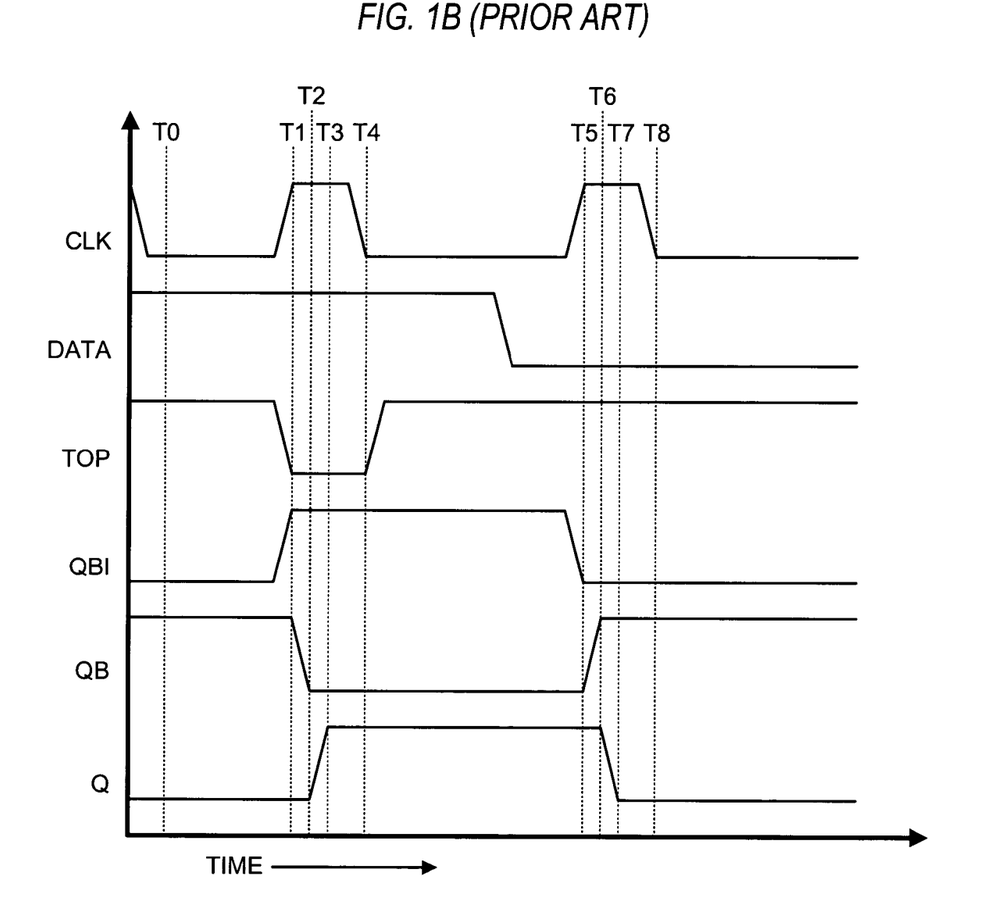
FIG. 1B is a timing diagram illustrating operation of the inverting domino register of FIG. 1, in which selected signals are plotted versus time.

FIG. 1B is a timing diagram illustrating operation of the inverting domino register 100, in which the CLK, DATA, TOP, QBI, QB and Q signals are plotted versus time. At a time T0 when the CLK signal is initially low, N2 is turned off and P1 is turned on, so that the domino stage pre-charges the TOP signal high. The TOP signal is pre-charged high in preparation for evaluation of the DATA signal upon the rising edge of CLK. The DATA signal is initially high. Since TOP is high, device P2 is off and since CLK is low, device N3 is off. This isolates signal QBI from the input stage so that it remains at its former state and is held there by the keeper circuit 111. As shown, the QBI signal is initially low at time T0 and the QB signal is initially driven high by the inverter/buffer 109. The inverter/buffer 109 protects the output of the keeper circuit 111 from the adverse affects of noise and yields output QB, which is an inverted state of the logic function evaluation of the DATA signal.

At subsequent time T1, the CLK signal is asserted high which turns N2 on and P1 off. Since the DATA signal is high at time T1, N1 is also on so that the TOP signal is discharged low after a short delay through N1 and N2. Negligible delays are ignored in the timing diagrams. The QBI signal is also asserted high at about time T1, and the QB signal is asserted low at time T2 after the delay through the inverter/buffer 109. The CLK signal subsequently goes low at time T4 and the TOP signal is pre-charged high once again by P1. Signal QBI is once again isolated from the input stage by devices P2 and N3, so the state of the QBI signal remains high via operation of the keeper circuit 111, and the QB remains low. At subsequent time T5, the CLK signal is once again asserted high while the DATA signal is low, so that N1 and P1 are both off. The TOP signal remains high so that both N3 and N4 are turned on discharging the QBI signal low at about time T5. The QB goes high at time T6 after the delay through the inverter/buffer 109. The respective states of the TOP, QBI and QB signals remain unchanged throughout the remainder of the clock cycle including when the CLK signal next goes low at time T8. The only constraint placed on the DATA signal is that it remains unchanged while the signal CLK is high. CLK is usually a pulse having a short high time.

It is noted that the inverting domino register 100 is implemented as a simple D flip-flop in which N1 is used as the sole device in the evaluation circuit for evaluating the DATA signal (i.e., the D input). As appreciated by those of ordinary skill in the art, however, more complex logic evaluation functions can be substituted in place of device N1. The domino register is considered "inverting" since the QB output signal is asserted to the opposite state of the DATA input signal evaluated upon each rising edge of CLK. If the inverter/buffer 115 is included, as further described below, then the state of the Q signal follows the QBI signal after the delays through both of the inverters 109 and 115. As shown, the Q signal goes high at time T3 after the delay through the inverter/buffer 115 in response to QB going low at time T2, and the Q signal goes low again at time T7 in response to QB going high at time T6.

The inverting domino register 100 exhibits a minimized setup time and an acceptable data-to-out time under conditions in which an inverted state of the logic evaluant is acceptable. In cases in which a non-inverted registered output is required, however, designers have been forced to deal with disadvantageous consequences. To produce the non-inverted output Q, designers typically had to add the inverter 115 to invert QB to provide the non-inverted output Q. This workaround, however, inserted additional delay to the register. As shown, for example, the delay through the inverter/buffer 115 from times T2 to T3 and T6 to T7 is added to the delay through the inverter/buffer 109 from times T1 to T2 and T5 to T6, respectively. The delays are increased using larger buffer devices with increased capacitance. It is noted that the delay through the inverter 109 may be reduced somewhat by reducing its size if the inverter/buffer 115 is provided to drive the output. Nonetheless, the total delay remains significant for the non-inverting case. For devices implemented using a 0.18 micron process, for example, the additional delay is approximately 30 picoseconds (ps).

In time-critical paths, an alternative workaround is to take the intermediate output signal QBI as the registered output. This second alternative, however, exposes the weak keeper circuit 111 to noise conditions under which the stability of the QBI signal is put at risk. Hence, in order to produce a non-inverted output, the state of the art for domino-type registers required that designers either accept additional delay or risk stability of the output.

SUMMARY OF THE INVENTION

A non-inverting domino register according to an embodiment of the present invention includes a complementary pair of evaluation devices responsive to a clock signal, evaluation logic, a storage stage, a keeper circuit and an output stage. The evaluation logic is coupled between the complementary pair of evaluation devices at a pre-charged node, and evaluates a logic function based on at least one input data signal. The storage stage drives a first preliminary output node and includes a first pull-up device and a first pull-down device, which are both responsive to the pre-charged node. The storage stage further includes a second pull-down device responsive to the clock signal. The keeper circuit has an input coupled to the first preliminary output node and an output that drives a second preliminary output node. The output stage includes a second pull-up device and a third pull-down device which are both responsive to the pre-charged node to drive an output node. The output node further includes a third pull-up device and a fourth pull-down device, which are both responsive to the second preliminary output node to drive the output node.

The non-inverting domino register may be implemented using P-channel and N-channel devices. For example, the complementary pair of evaluation devices, the storage stage and the output stage may each be implemented using P-channel and N-channel devices. The evaluation logic may range from very simple to very complex, and may be, for example, a complex logic circuit. In one embodiment, the keeper circuit is a pair of inverters cross-coupled between the first and second preliminary output nodes. The inverters may be relatively small devices to minimize delay. The feedback inverter of the keeper may be replace with an enabled inverter.

A register according to an embodiment of the present invention includes an evaluation circuit, a storage circuit, a keeper circuit, and an output circuit. The evaluation circuit pre-charges a first node while a clock signal is low and evaluates a logic function for controlling the state of the first node when the clock signal goes high. The storage circuit is coupled to the first node and receives the clock signal. The storage circuit drives a second node high if the first node is low and drives the second node low if the first node stays high when the clock signal goes high. The keeper circuit maintains the state of the second node when not otherwise driven and drives a third node to an inverted logic state as the second node. The output circuit drives an output node high if the first or third nodes are low and drives the output node low if the first and third nodes are both high. The register may be implemented using P-channel and N-channel devices.

A method of registering a logic function and generating a non-inverted output signal according to an embodiment of the present invention includes pre-setting a first node while a clock signal is in a first logic state, evaluating a logic function to control the logic state of the first node when the clock signal transitions to a second logic state, driving a second node to an opposite logic state of the first node in response to the clock signal transitioning to its second logic state, maintaining the second node at its previously driven logic state, driving a third node to an opposite logic state as the second node, and driving an output node based on the states of the first and third nodes.

The method may include pre-charging the first node to a high logic state. The method may also include pulling the second node high if the first node is low, and pulling the second node low if the clock and first nodes are both high. The method may further include pulling the output node high if either of the first and third nodes is low, and pulling the output node low if the first and second nodes are both high.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing registered outputs for logic circuits in which speed, size and stability are critical factors. He has therefore developed a non-inverting domino register that has a faster data-to-output time than conventional approaches without compromising the stability of the output, as will be further described below with respect to FIGS. 2A–4. When employed in a pipeline architecture that relies heavily on registers to transfer data from stage to stage, a non-inverting domino register according to embodiments of the present invention enables overall device operating speed to be significantly increased.

Figure 2A:
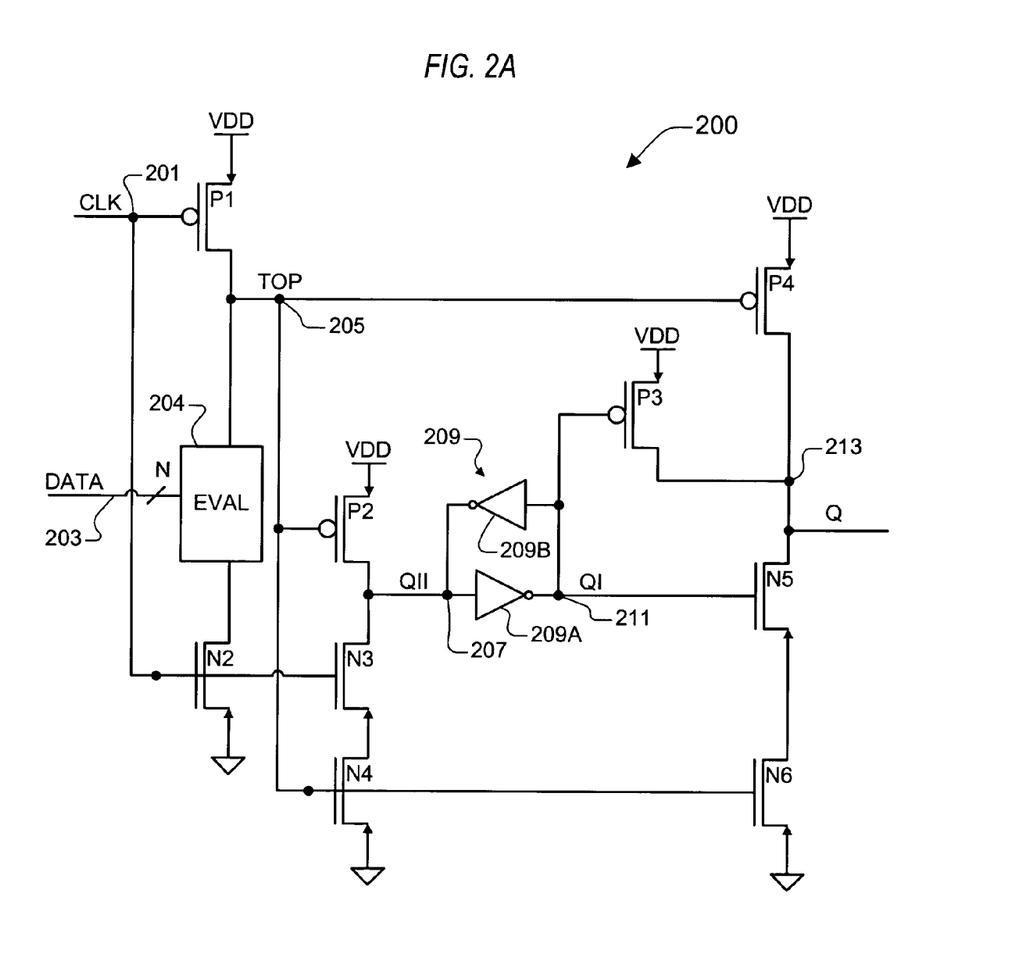
FIG. 2A is a schematic diagram of a non-inverting domino register implemented according to an exemplary embodiment of the present invention.

FIG. 2A is a schematic diagram of a non-inverting domino register 200 implemented according to an exemplary embodiment of the present invention. The non-inverting domino register 200 includes a logic evaluation input stage, or domino stage, which consists of stacked P-channel and N-channel devices P1 and N2 and evaluation logic 204. The logic evaluation input stage of the non-inverting domino register 200 is similar to the logic evaluation input stage of the inverting domino register 100 in which the devices P1 and N2 are a complementary pair of evaluation devices on either side of evaluation logic 204. The evaluation device N1 is replaced by the evaluation logic 204, which may be as simple as N1 or which may be significantly more complex for evaluation any desired logic function. The source of P1 is coupled to a voltage source VDD and its drain is coupled to node 205 providing a signal TOP. The evaluation logic 204 is coupled between node 205 and the drain of N2. The source of N2 is coupled to ground. An input clock signal CLK is provided via node 201 to the gates of P1 and N2. A set of N nodes 203 provide N input data signals DATA to the evaluation logic 204, where N is any positive integer.

The domino stage of the non-inverting domino register 200 is followed by a storage stage including devices P2, N3 and N4. Node 201 is coupled to the gate of N3 and node 205 is coupled to the gates of P2 and N4. The source of P2 is coupled VDD and its drain is coupled to a first intermediate output node 207 providing a first intermediate output signal QII. Node 207 is coupled to the drain of N3, to the input of an inverter 209A and to the output of another inverter 209B. The output of the inverter 209A is coupled to a second intermediate output node 211 providing a second intermediate output signal QI, which is coupled to the input of the inverter 209B. The inverters 209A and 209B are cross-coupled between nodes 207 and 211 and collectively form a weak keeper circuit 209. The source of N3 is coupled to the drain of N4, which has its source coupled to ground.

The storage stage of the non-inverting domino register 200 is followed by an additional output stage, which includes P-channel devices P3 and P4 and N-channel devices N5 and N6. Node 205 is coupled to the gates of P4 and N6, and node 211 is coupled to the gates of P3 and N5. The sources of P3 and P4 are coupled to VDD and their drains are coupled together at an output node 213 providing an output signal Q. Output node 213 is coupled to the drain of N5, which has its source coupled to the drain of N6, which has its source coupled to ground. The P-channel devices generally operate as pull-up devices and the N-channel devices generally operate as pull-down devices as further described below.

Figure 2B:
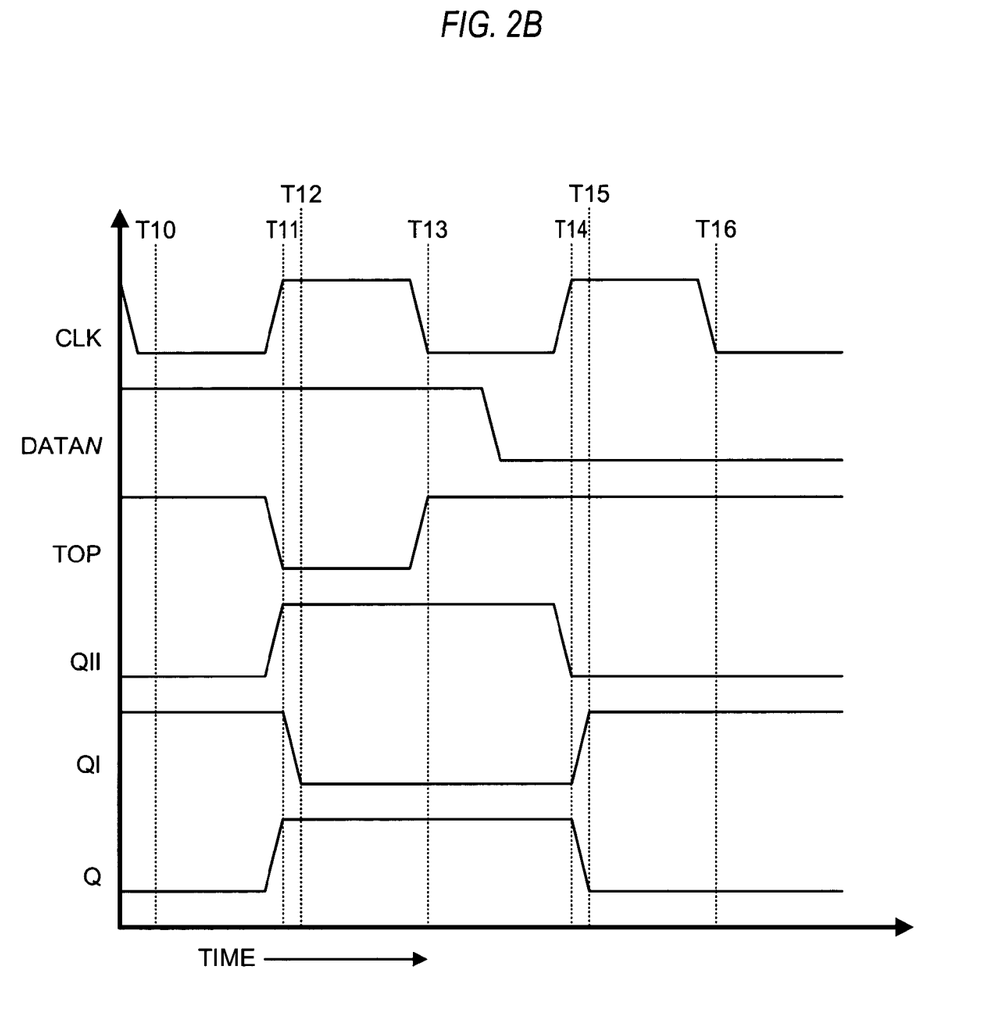
FIG. 2B is a timing diagram illustrating operation of the non-inverting domino register of FIG. 2A, in which selected signals are plotted versus time.

FIG. 2B is a timing diagram illustrating operation of the non-inverting domino register 200, in which the CLK, DATAN, TOP, QII, QI and Q signals are plotted versus time. The DATAN signal is shown as a single signal representing the collective set of N DATA signals. The sole DATAN signal is shown asserted high for when the collective state of the data signals causes the evaluation logic 204 to evaluate thereby pulling the TOP signal low. The DATAN signal is shown asserted low for when the evaluation logic 204 fails to evaluate, which keeps the TOP signal high. At time T10 when the CLK signal is initially low, N2 is turned off and P1 is turned on, so that the domino stage pre-charges the TOP signal high. The TOP signal is pre-charged high in preparation for evaluation of the DATAN signal upon the rising edge of CLK. The pre-charged TOP signal turns on N4 and N6. The DATAN signal is initially high. The QII signal remains at its former state (shown initially in a low logic state) and is held there by the keeper circuit 209. The QI signal is initially high turning on N5, so that the Q output signal is initially pulled low via N5 and N6.

At time T11 the CLK signal goes high, which causes the TOP signal to discharge low since the DATAN signal is high. In particular, N2 is turned on and the evaluation logic 204 evaluates pulling TOP low. After negligible delay through P2 and P4, the QII and Q signals are both pulled high at about the same time T11. The QI signal is pulled low at time T12 after the delay through the inverter 209A. The inverted state of the QI signal at the output of the keeper circuit 209 drives the devices P3 and N5. If QI is high, then P3 is off and N5 is on; and if QI is low, then P3 is on and N5 is off. At subsequent time T13 when the CLK signal next goes low, the TOP signal is once again pre-charged high. The respective states of the QII and QI signals remain unchanged via operation of the keeper circuit 209, so that the Q signal remains high throughout the remainder of the half cycle of CLK.

The CLK signal is next asserted high at time T14 while the DATAN signal is low. The evaluation logic 204 fails to evaluate, so that TOP remains high. The CLK and TOP signals turn on devices N3 and N4, so that the QII signal is asserted low at about time T14. The QI signal is consequently pulled high at time T15 after the delay through the inverter 209A. The QI signal turns N5 on and P3 off, so that the Q signal goes low at about time T15 after negligible delay. Once again, the respective states of the QII and QI signals remain unchanged via operation of the keeper circuit 209 when the CLK signal next goes low at time T16, so that the Q signal remains low throughout the remainder of the cycle of CLK.

It has been shown that the Q signal transitions from low to high very quickly in response to a rising edge of the CLK signal when the evaluation logic 204 evaluates discharging the TOP signal low. There is only a negligible delay through devices N2 and P4 causing the output transition. It has also been shown that the Q signal transitions from high to low after only a relatively small delay through devices N3, N5 and the inverter 209A in response to a rising edge of the CLK signal when the evaluation logic 204 fails to evaluate leaving the TOP signal high. The delay through the inverter 209A is minimized by being implemented as a relatively small device (with minimal capacitance) since it does not need to have the size nor perform the function of a buffer. Thus, the delay from time T14 to T15 is relatively short.

It is appreciated by those of ordinary skill in the art, therefore, that transitions of the output Q signal of the non-inverting domino register 200 are very fast in response to transitions of the CLK signal in contrast to the slower transition responses of the inverting domino register 100 with the output inverter/buffer 115 attached to the output. If a non-inverting output is necessary or otherwise desired, the non-inverting domino register 200 is clearly superior in terms of data-to-output speed among other benefits and advantages as described herein. The non-inverting domino register 200 may be converted to an inverting domino register simply by adding an output inverter/buffer (not shown), which provides a speed advantage over the inverting domino register 100 without the added inverter/buffer 115. The inverting domino register 100 might be an acceptable choice, however, if an inverting output is allowed since it uses less devices, is somewhat smaller and consumes less power assuming that the inverter/buffer 115 is not used.

Figure 3:
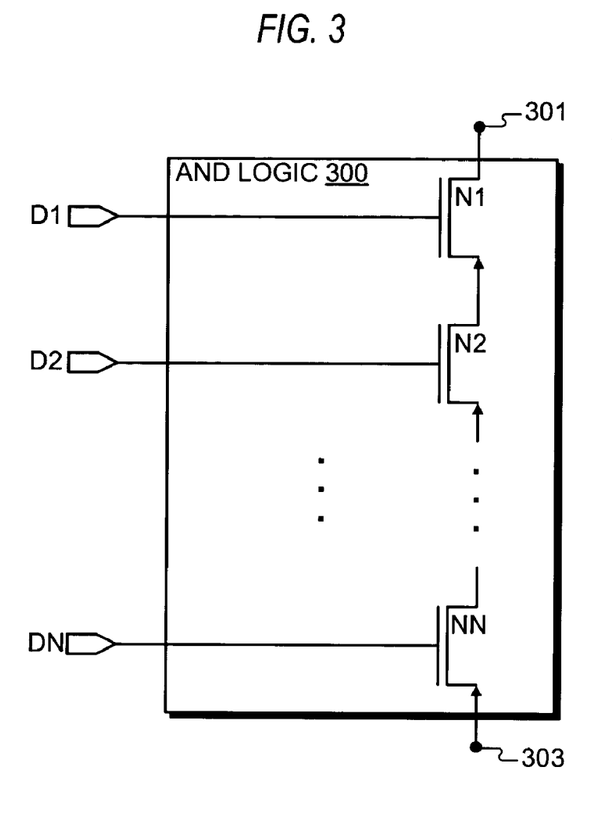
FIG. 3 is a schematic diagram of exemplary AND logic that may be used to implement the evaluation logic of FIG. 2A according to one embodiment of the present invention.

FIG. 3 is a schematic diagram of exemplary AND logic 300 that may be used to implement the evaluation logic 204 according to one embodiment. The AND logic 300 includes a stack of N-channel devices N1, N2, . . . , NN coupled in series between nodes 301 and 303. In this case, node 301 is coupled to node 205 and node 303 is coupled to the drain of N2 to replace the evaluation logic 204. Each N-channel device N1–NN includes a gate that receives a corresponding one of a series of data input signals D1, D2, . . . , DN. The AND logic 300 evaluates when all of the D1–DN signals are high, and fails to evaluate when any one of the D1–DN signals is low.

Figure 4:
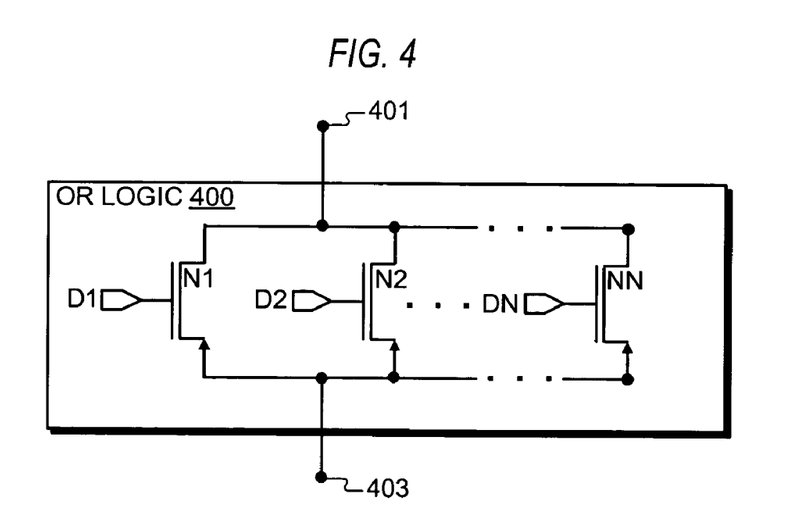
FIG. 4 is a schematic diagram of exemplary OR logic that may be used to implement the evaluation logic of FIG. 2A according to another embodiment of the present invention.

FIG. 4 is a schematic diagram of exemplary OR logic 400 that may be used to implement the evaluation logic 204 according to another embodiment. The OR logic 400 includes a series of N-channel devices N1, N2, . . . , NN coupled in parallel between nodes 401 and 403. In this case, node 401 is coupled to node 205 and node 403 is coupled to the drain of N2 to replace the evaluation logic 204. Each N-channel device N1–NN includes a gate that receives a corresponding one of a series of data input signals D1, D2, . . . , DN. The OR logic 400 evaluates when any one of then D1–DN signals is high, and fails to evaluate when all of the D1–DN signals are low.

The logic circuits 300 and 400 are exemplary only and are provided to illustrate that the evaluation logic 204 may be any complex logical evaluation circuit as appreciated by those having ordinary skill in the art. Any suitable combination of the AND and OR logic circuits are contemplated. Any other complex logical evaluation circuit are contemplated, including, for example, multiple input multiplexers (muxes), multi-bit encoders, etc. Any desired simple to complex evaluation logic can be substituted for the evaluation logic 204 without adversely impacting the speed or associated power constraints of the non-inverting domino register 200. Regardless of the configuration of the evaluation logic 204, the non-inverting domino register 200 exhibits a significantly reduced data-to-output time without inverting the output signal Q and without compromising the stability of the output signal Q.

Although the present invention has been described in considerable detail with reference to certain preferred versions thereof, other versions and variations are possible and contemplated. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A non-inverting domino register, comprising:
   a complementary pair of evaluation devices responsive to a clock signal;
   evaluation logic, coupled between said complementary pair of evaluation devices at a pre-charged node, that evaluates a logic function based on at least one input data signal;
   a storage stage driving a first preliminary output node, said storage stage comprising a first pull-up device and a first pull-down device both responsive to said pre-charged node, and a second pull-down device responsive to said clock signal;
   a keeper circuit having an input coupled to said first preliminary output node and an output that drives a second preliminary output node; and
   an output stage driving an output node, said output stage comprising a second pull-up device and a third pull-down device both responsive to said pre-charged node and a third pull-up device and a fourth pull-down device both responsive to said second preliminary output node.

2. The non-inverting domino register of claim 1, wherein said complementary pair of evaluation devices comprises:
   a P-channel device having a gate receiving said clock signal and a drain and source coupled between a source voltage and said pre-charged node; and
   an N-channel device having a gate receiving said clock signal and a drain and source coupled between said evaluation logic and ground.

3. The non-inverting domino register of claim 1, wherein said evaluation logic comprises a complex logic circuit.

4. The non-inverting domino register of claim 1, wherein said storage stage comprises:
   a P-channel device having a gate coupled to said pre-charged node and a drain and source coupled between a source voltage and said first preliminary output node;
   a first N-channel device having a gate receiving said clock signal, a drain coupled to said first preliminary output node and a source; and
   a second N-channel device having a gate coupled to said pre-charged node, a drain coupled to said source of said first N-channel device and a source coupled to ground.

5. The non-inverting domino register of claim 4, wherein said keeper circuit comprises a pair of inverters cross-coupled between said first and second preliminary output nodes.

6. The non-inverting domino register of claim 1, wherein said output stage comprises:
   a first P-channel device having a gate coupled to said pre-charged node and a drain and source coupled between a source voltage and said output node;

a second P-channel device having a gate coupled to said second preliminary output node, a source coupled to said source voltage and a drain coupled to said output node;

a first N-channel device having a gate coupled to said second preliminary output node, a drain coupled to said output node and a source; and a second N-channel device having a gate coupled to said pre-charged node, a drain coupled to said source of said first N-channel device and a source coupled to ground.

7. A register, comprising:

an evaluation circuit that pre-charges a first node while a clock signal is low and that evaluates a logic function for controlling the state of the first node when said clock signal goes high;

a storage circuit, coupled to said first node and receiving said clock signal, that drives a second node high if said first node is low and that drives the second node low if said first node stays high when said clock signal goes high;

a keeper circuit, coupled to said second node, that drives a third node to an inverted logic state as said second node; and an output circuit having a first input coupled to said first node, a second input coupled to said third node and an output coupled to an output node, that drives said output node high if said first or third nodes are low and that drives said output node low if said first and third nodes are both high.

8. The register of claim 7, wherein said evaluation circuit comprises:

a P-channel device, coupled to said first node and receiving said clock signal, that pre-charges said first node while said clock signal is low;

a logic circuit, coupled to said first node, that evaluates said logic function based on at least one input data signal; and an N-channel device, coupled to said logic circuit and receiving said clock signal, that enables said logic circuit to evaluate said logic function when said clock signal goes high.

9. The register of claim 7, wherein said storage circuit comprises:

a P-channel device, coupled to said first and second nodes, that pulls said second node high if said first node goes low;

a first N-channel device, coupled to said second node and receiving said clock signal; and a second N-channel device, coupled to said first N-channel device and to said first node;

wherein said first and second N-channel devices collectively pull said second node low if said first node remains high in response to said clock signal going high.

10. The register of claim 7, wherein said keeper circuit comprises a pair of cross-coupled inverters coupled between said second and third nodes.

11. The register of claim 7, wherein said output circuit comprises:

a fast P-channel device that pulls said output node high when said fast node is low;

a second P-channel device that pulls said output node high when said third node is low; and first and second N-channel devices that collectively pull said output node low when said fast and third nodes are both high.

12. A method of registering a logic function and generating a non-inverted output signal, comprising:

pre-setting a first node while a clock signal is in a fast logic state;

evaluating a logic function to control the logic state of the first node when the clock signal transitions to a second logic state;

driving a second node to an opposite logic state of the first node in response to the clock signal transitioning to its second logic state;

maintaining the second node at its previously driven logic state when the clock signal transitions back to the first logic state from the second logic state;

driving a third node to an opposite logic state of the second node; and driving an output node based on the states of the first and third nodes wherein the output node is driven by an output stage, and wherein the output stage comprises a first pull-up device and a first pull-down device, both responsive to the first node, and a second pull-up device and a second pull-down device, both responsive to the third node.

13. The method of claim 12, wherein said pre-setting a first node comprises pre-charging the first node to a high logic state.

14. The method of claim 12, wherein said maintaining the second node at its previously driven logic state comprises coupling a keeper circuit to the second node.

15. The method of claim 12, wherein said driving a second node comprises:

pulling the second node high if the first node is low; and pulling the second node low if the clock and first nodes are both high.

16. The method of claim 12, wherein said driving a third node comprises inverting the state of the second node.

17. The method of claim 12, wherein said driving an output node comprises:

pulling the output node high if either of the first and third nodes is low; and pulling the output node low if the first and third nodes are both high.

* * * * *